United States Patent [19]

Yamashita

[11] Patent Number: 5,065,415
[45] Date of Patent: Nov. 12, 1991

[54] PROGRAMMABLE FREQUENCY DIVIDER

[75] Inventor: Kazuo Yamashita, Mitaka, Japan

[73] Assignee: Nihon Musen Kabushiki Kaisha, Tokyo, Japan

[21] Appl. No.: 482,990

[22] Filed: Feb. 21, 1990

[30] Foreign Application Priority Data

Oct. 23, 1989 [JP] Japan ................................ 1-276315

[51] Int. Cl.[5] ............................................ H03K 21/38
[52] U.S. Cl. ...................................... 377/52; 377/110; 377/111
[58] Field of Search ...................... 377/47, 48, 52, 110, 377/108, 111

[56] References Cited

U.S. PATENT DOCUMENTS

| | | | |
|---|---|---|---|
| Re. 32,605 | 2/1988 | Yamashita et al. | 377/108 |
| 3,202,837 | 8/1965 | Baracket | 377/110 |
| 4,053,739 | 10/1977 | Miller et al. | 377/52 |
| 4,184,068 | 1/1980 | Washburn | 377/52 |
| 4,394,769 | 7/1983 | Lull | 377/108 |
| 4,715,052 | 12/1987 | Stambaugh | 377/108 |

FOREIGN PATENT DOCUMENTS 3142167 7/1982 Fed. Rep. of Germany.

OTHER PUBLICATIONS

PLL, Thomas Schreiner, pp. 82-85, ELO, 1979.

*Primary Examiner*—John S. Heyman
*Attorney, Agent, or Firm*—Frishauf, Holtz, Goodman & Woodward

[57] ABSTRACT

A programmable frequency divider for dividing the frequency of a supplied high-frequency signal directly into a lower frequency includes a plurality of 2-scale-factor prescalers or programmable frequency divider units each capable of being switched between divide-by-2 and divide-by-3 modes. The 2-scale-factor prescalers are connected in cascade for producing an output signal which is frequency-divided at one of multiple division ratios at a time.

5 Claims, 3 Drawing Sheets

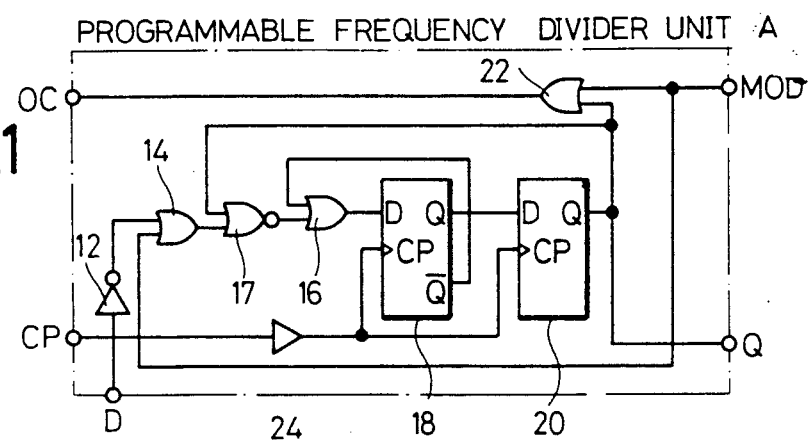
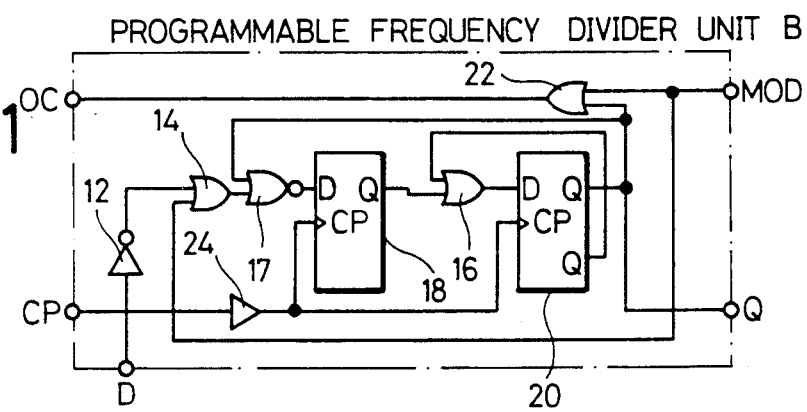
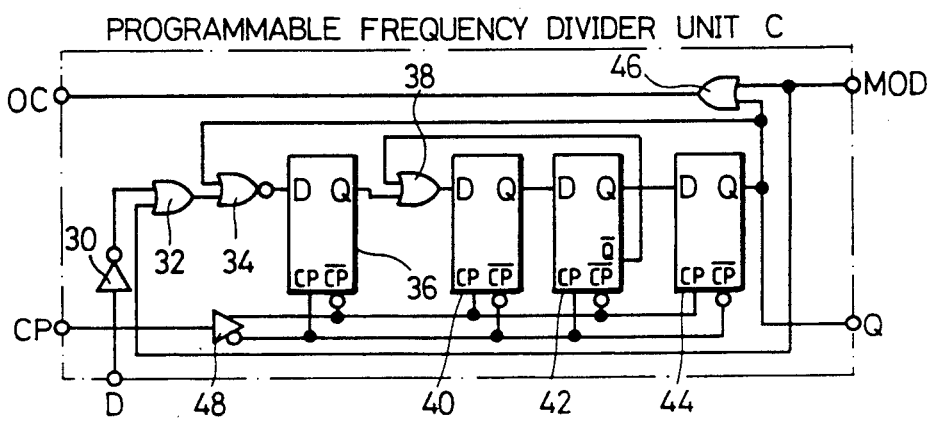

PROGRAMMABLE FREQUENCY DIVIDER

BACKGROUND OF THE INVENTION

The present invention relates to a programmable frequency divider for producing a desired output frequency which is a variable integral submultiple of the input frequency.

One conventional means for dividing high frequencies is known as a programmable frequency divider, called an early-decode programmable divider, for dividing a high input frequency directly into a desired output frequency. Such a programmable frequency divider is also referred to as a direct programmable frequency divider.

The programmable frequency divider comprises a pulse counter which is composed of T-type flip-flops connected in cascade. The pulse counter is first preset to a division ratio signal. When the pulse counter counts down to zero, it is preset to the division ratio signal again.

According to another programmable frequency divider which also comprises a pulse counter in the form of cascaded T-type flip-flops, the pulse counter is first preset to a division ratio signal, and when the pulse counter counts down to 2, the remaining pulses are counted by a shift register, during which time the pulse counter is preset to the division ratio signal again.

The conventional programmable frequency dividers are operable under increased maximum frequencies. However, if much higher frequencies are to be divided, the time required for signal processing, i.e., to preset the pulse counter to a division ratio signal, will cause an appreciable delay. Due to such a delay in signal processing, there are not presently available any direct variable frequency dividers which can operate at a maximum frequency of few hundreds MHz.

For processing signals of higher maximum frequencies, it has been customary to employ a prescaler, a frequency mixer, or the like to convert a higher input frequency into a lower output frequency. Such a circuit arrangement is complex and large in scale, and involves a large number of signal processing cycles. There has been a demand for a programmable frequency divider which will eliminates these drawbacks.

SUMMARY OF THE INVENTION

It is a general object of the present invention to provide a programmable frequency divider for use in PLLs (phase-locked loops), which is capable of dividing a higher input frequency directly into a desired lower output frequency.

Another object of the present invention is to provide a programmable frequency divider which is capable of dividing a higher input frequency directly into a variable lower output frequency without the need for an increased circuit scale and an increased number of signal processing cycles.

Still another object of the present invention is to provide a programmable frequency divider for dividing the frequency of a supplied high-frequency signal directly into a lower frequency, comprising: a plurality of 2-scale-factor prescalers each capable of being switched between divide-by-2 and divide-by-3 modes, the 2-scale-factor prescalers being connected in cascade for producing an output signal which is frequency-divided at one of multiple division ratios at a time.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIGS. 1(a) through 1(c) are block diagrams of programmable frequency divider units according to the present invention which can be switched between divide-by-2 and divide-by-3 modes;

DETAILED DESCRIPTION OF THE PREFERRED EMBODIMENTS

Figure 2:
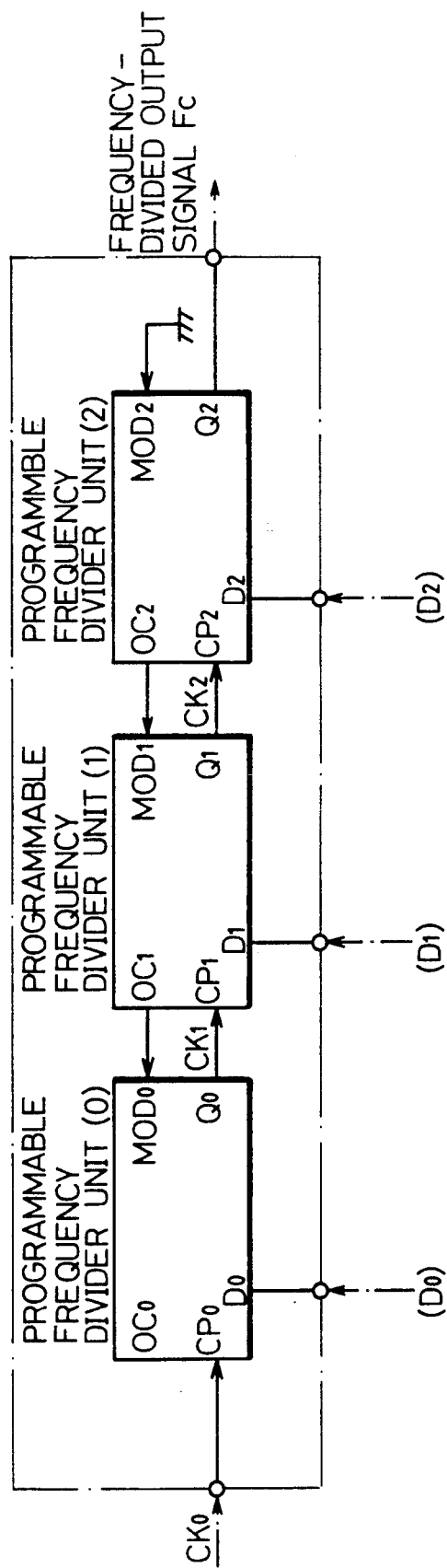
FIG. 2 is a block diagram of a programmable frequency divider according to a first embodiment of the present invention, the programmable frequency divider comprising three programmable frequency divider units connected in cascade.
Figure 3:
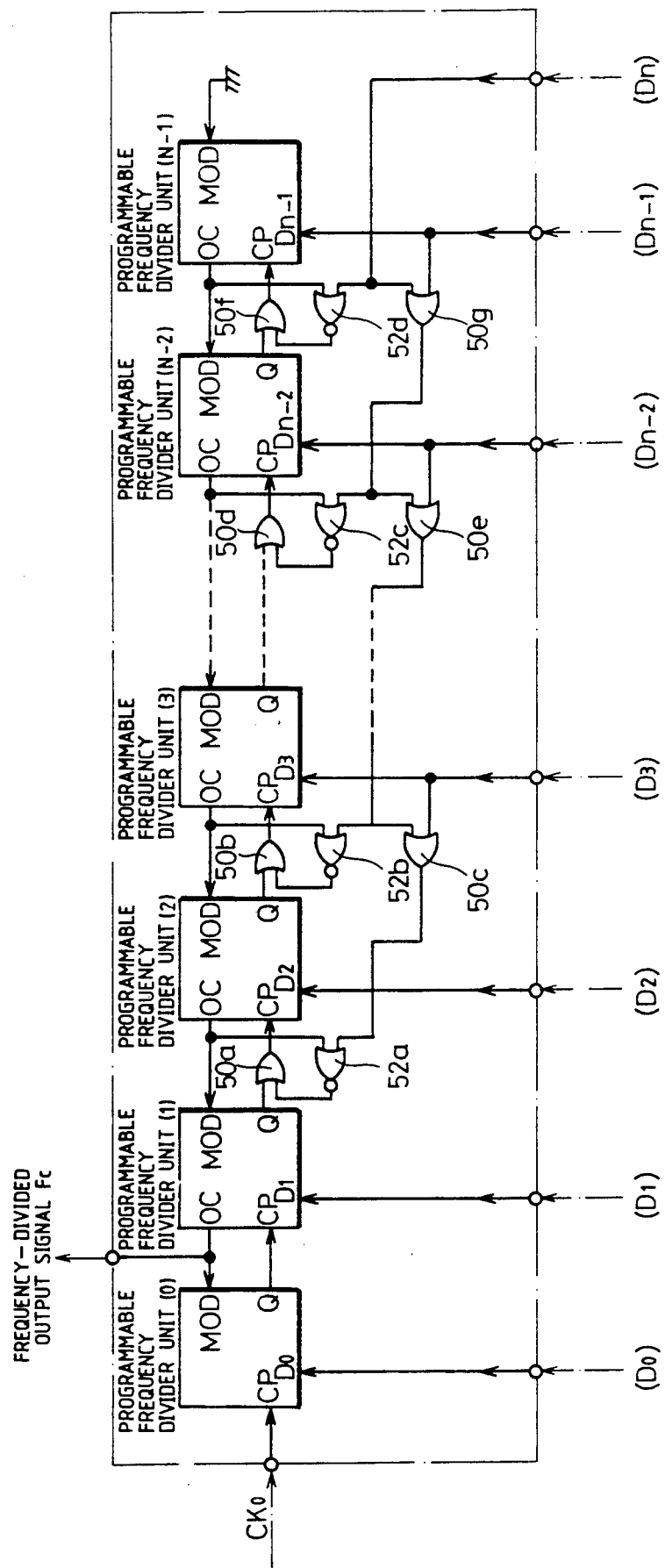
FIG. 3 is a block diagram of a programmable frequency divider according to a second embodiment of the present invention, the programmable frequency divider comprising N programmable frequency divider units connected in cascade.

FIGS. 1(a) through 1(c) show programmable frequency divider units according to the present invention, each capable of being switched between divide-by-2 and divide-by-3 modes. FIG. 2 shows a programmable frequency divider according to a first embodiment of the present invention, which comprises three cascaded programmable frequency divider units shown in FIGS. 1(a) through 1(c) and which has a division ratio variable in the range of from $2^3$ to $2^4-1$. FIG. 3 shows a programmable frequency divider according to a second embodiment of the present invention, which comprises N cascaded programmable frequency divider units shown in FIGS. 1(a) through 1(c) and which has a division ratio variable in the range of from $2^2$ to $2^{n+1}-1$.

The programmable frequency divider units which can be switched between divide-by-2 and divide-by-3 modes, i.e., 2-scale-factor prescalers, denoted at A, B, C in FIGS. 1(a), 1(b), 1(c), respectively, will first be described below.

The programmable frequency divider unit A shown in FIG. 1(a) comprises an inverter 12, an OR gate 14 connected to the inverter 12, a NOR gate 17 connected to the OR gate an OR gate 16 connected to the NOR gate 17 a D-type flip-flop (D-FF) 18 whose terminal is coupled to the OR gate 16, a D-FF 20 connected to the D-FF 18, an OR gate 22, and a buffer amplifier 24 connected to the CP terminals of the D-FFs 18, 20.

The programmable frequency divider unit B shown in FIG. 1(b) is similar to the programmable frequency divider unit A shown in FIG. 1(a), except that the OR gate 16 is connected between the Q terminal of the D-FF 18 and the D terminal of the D-FF 20.

The programmable frequency divider unit C shown in FIG. 1(c) comprises an inverter 30, an OR gate 32 connected to the inverter 30, a NOR gate 34 connected to the OR gate 32, a D latch 36 connected to the NOR gate 34, an OR gate 38 connected to the D latch 36, D latches 40, 42, 44, an OR gate 46, and a buffer amplifier 48 coupled to the CP terminals of the D latches 36, 40, 42, 44.

The programmable frequency divider units A, B, C operate as follows:

When an input signal applied to a MOD terminal of each of the variable frequency divider units A, B, C is of an H level (=1), an H-level signal is delivered (output) to an OC terminal, and the frequency of a clock signal which is input to a CP terminal is divided at its positive edges by 2 into a half frequency, which is then delivered to a Q terminal.

When an input signal applied to the MOD terminal is of an L level (=0), a signal of the same level as that of the signal at the Q terminal is delivered to the OC terminal. If an input signal applied to a D terminal is of an H level, then the frequency of a clock signal which is input to the CP terminal is divided at its positive edges by 3 into a one-third frequency, which is then delivered to the Q terminal. If an input signal applied to the D terminal is of an L level, then the frequency of a clock signal which is input to the CP terminal is divided at its positive edges by 2 into a half frequency, which is then delivered to the Q terminal.

A plurality of any of the programmable frequency divider units A, B, C or a combination thereof are connected in cascade. The nth programmable frequency divider unit (A, B, or C) of such a cascaded circuit arrangement once divides the frequency of an input cock signal by $2+D(D=0$ or 1) depending on the level of the signal applied to the D terminal, and thereafter divides the frequency by 2, when output signals from the Q terminals of the subsequent programmable frequency divider units are all zero. Therefore, the frequency of the input clock signal can be variably divided by multiple division ratios.

According to the first embodiment illustrated in FIG. 2, three of any of the programmable frequency divider units A, B, C or a combination thereof are connected in cascade so that an output signal Fc whose frequency is variably divided is obtained.

The programmable frequency divider shown in FIG. 2 comprises three cascaded programmable frequency divider units (0), (1), and (2).

In the programmable frequency divider unit (2), an input signal applied to a $MOD_2$ terminal is always of an L level. The programmable frequency divider unit (2) divides the frequency of a signal $CK_2$ by 2 when a signal ($D_2$) applied to a $D_2$ terminal is of an L level (=0), and divides the frequency of the signal $CK_2$ by 3 when a signal applied to the $D_2$ terminal is of an H level (=1). Thus, the frequency of the signal $CK_2$ is divided by $2+D_2(D_2=0$ or 1).

In the programmable frequency divider unit (1), in order to produce a clock signal having $2+D_2$ pulses at a $Q_1$ terminal ($=CK_2$), the frequency of the signal $CK_1$ is divided once by $2+D_1(D_1=0$ or 1) and then $1+D_1$ times by 2 at a $Q_0$ terminal ($=CK_1$). As a result, the programmable frequency divider units (1) and (2) divide the input frequency by:

$$1\times(2+D_1)+(1+D_2)\times 2 = (2+D_2)\times 2+D_1 \quad (1)$$

Likewise, in order to produce a clock signal having $(2+D_2)\times 2+D_1$ pulses at a $Q_0$ terminal ($=CK_1$), the programmable frequency divider unit (0) divides a signal $CK_0$ by:

$$[(2+D_2)\times 2+D_1]\times 2+D_0 \quad (2)$$

Therefore, the programmable frequency divider as a whole divides the input frequency by:

$$2^3 D_2\times 2^2+D_1 2^1+D_0\times 2^0 \quad (3)$$

Similarly, a programmable frequency divider which comprises n programmable frequency divider units (A, B, C) connected in cascade divides the input frequency by:

$$2^n+D_{n-1}\times 2^{n-1}+\ldots+D_2\times 2^2+D_1\times 2^1+D_0\times 2^0 \quad (4)$$

Therefore, the programmable frequency divider of the present invention serves as a direct programmable frequency divider for continuously dividing the input frequency by:

$$2^n \sim 2^{n+1}-1 \quad (5)$$

with the nth bit being fixed to the H level (=1).

According to the second embodiment shown in FIG. 3, the programmable frequency divider comprises N cascaded programmable frequency divider units (A, B, C) for continuously dividing the input frequency by $2^2 \sim 2^{n+1}-1$ the represented by the equation (5).

The programmable frequency divider shown in FIG. 3 has a programmable frequency divider unit (0), a variable frequency divider unit (1), a programmable frequency divider unit (2), a variable frequency divider unit (3), ..., a programmable frequency divider unit (N−2), a programmable frequency divider unit (N−1), OR gates 50a through 50g, and NOR gates 52a through 52d.

If data ($D_m \sim D_n$) of nth and following bits ($2 < m \leq n$) are zero, then the programmable frequency divider of the second embodiment operates equivalently to a programmable frequency divider which comprises (m−1) programmable frequency divider units (A, B, C) connected in cascade.

Where each of the cascaded programmable frequency divider units or 2-scale-factor prescalers is composed of a presently available bipolar or GaAs IC which can well operate under few GHz, the input frequency can be directly divided variably at high speed without the conventional presetting process.

The input frequency may be divided variably at negative edges thereof or through negative logic operation.

With the present invention, as described above, the programmable frequency divider for dividing the higher frequency of an input signal directly into a desired lower frequency comprises a plurality of 2-scale-factor prescalers connected in cascade, the prescalers being switchable between divide-by-2 and divide-by-3 modes, so that a frequency-divided output signal can be produced with different multiple division ratios. A higher input frequency can therefore be divided directly into a desired lower output frequency without the need for an increased circuit scale.

Although certain preferred embodiments have been shown and described, it should be understood that many changes and modifications may be made therein without departing from the scope of the appended claims.

What is claimed is:

1. A programmable frequency divider for dividing the frequency of a high-frequency signal supplied thereto directly into a lower frequency, comprising:
   a plurality of 2-scale-factor prescalers, each of said prescalers being switchable only between divide-by-2 and divide-by-3 modes, and said prescalers being connected in cascade for producing an output signal;

said respective prescalers each including means for setting the respective prescalers at one of said divide-by-2 or divide-by-3 modes, such that said frequency divider divides said supplied high-frequency signal by one of a plurality of different division ratios.

2. A programmable frequency divider for dividing the frequency of a supplied high-frequency signal directly into a lower frequency, comprising:

a plurality of 2-scale-factor prescalers each capable of being switched between divide-by2 and divide-by-3 modes, said 2-scale-factor prescalers being connected in cascade for producing an output signal which is frequency divided at one of multiple division ratios at a time;

each of said 2-scale-factor prescalers having a first terminal (MOD), a second terminal (D), a third terminal (CP), a fourth terminal (Q), and a fifth terminal (OC);

each of said prescalers being operable such that:
 (a) when the first terminal (MOD) is at an H (or L) level or the second terminal (D) is at an L level, a clock signal applied to the third terminal (CP) is frequency-divided by 2 at positive edges thereof, and a frequency-divided signal is sent to the fourth terminal (Q);
 (b) when the first terminal (MOD) is at an L (or H) level and the second terminal (D) is at an H level, a clock signal applied to the third terminal (CP) is frequency-divided by 3 at positive edges thereof, and a frequency-divided signal is sent to the fourth terminal (Q);
 (c) when the first terminal (MOD) is at an H (or L) level or the fourth terminal (Q) is at an H level, a signal of an H (or L) level is sent to the fifth terminal (OC); and
 (d) when the first terminal (MOD) is of an L (or H) level and the fourth terminal (Q) is at an L level, a signal of an L (or H) level is sent to the fifth terminal (OC); and wherein:

said 2-scale-factor prescalers are N in number and are connected in cascade such that an output signal from the fourth terminal (Q) of the (N−1)th prescaler is applied as an input signal to the third terminal (CP) of the Nth prescaler, and an output signal from the fifth terminal (OC) of the (N+1)th prescaler is applied as an input signal to the first terminal (MOD) of the Nth prescaler;

said Nth prescaler being operable such that when the output signal from the fifth terminal (OC) of the (N+1)th prescaler is of a L (or H) level, the Nth prescaler frequency-divides the input signal by (2+D) according to the level of the signal at the second terminal (D), and when the output signal from the fifth terminal (OC) of the (N+1)th prescaler is of an H (or L) level, the Nth prescaler frequency-divided the input signal by 2.

3. A programmable frequency divided according to claim 2, wherein said 2-scale-factor prescalers which are connected in cascade are arranged such that when all input signals applied to the second terminals of subsequent ones of the prescalers are of an L level, said subsequent prescalers are separated from the other prescalers.

4. A programmable frequency divider for dividing the frequency of a supplied high-frequency signal directly into a lower frequency, comprising:

a plurality of 2-scale-factor prescalers each capable of being switched between divide-by-2 and divide-by-3 modes, said 2-scale-factor prescalers being connected in cascade for producing an output signal which is frequency divided at one of multiple division ratios at a time;

each of said 2-scale-factor prescalers having a first terminal (MOD), a second terminal (D), a third terminal (CP), a fourth terminal (Q), and a fifth terminal (OC);

each of said prescalers being operable such that:
 (a) when the first terminal (MOD) is at an L (or H) level or the second terminal (D) is at an L level, a clock signal applied to the third terminal (CP) is frequency-divided by 2 at negative edges thereof, and a frequency-divided signal is sent to the fourth terminal (Q);
 (b) when the first terminal (MOD) is at an H (or L) level and the second terminal (D) is at an H level, a clock signal applied to the third terminal (CP) is frequency-divided by 3 at negative edges thereof, and a frequency-divided signal is sent to the fourth terminal (Q);
 (c) when the first terminal (MOD) is at an L (or H) level or the fourth terminal (Q) is at an L level, a signal of an L (or H) level is sent to the fifth terminal (OC), and that when the first terminal (MOD) is of an H level, a signal of an H (or L) level is sent to the fifth terminal (OC); and wherein:

said 2-scale-factor prescalers are N in number and are connected in cascade such that an output signal from the fourth terminal (Q) of the (N−1)th prescaler is applied as an input signal to the third terminal (CP) of the Nth prescaler, and an output signal from the firth terminal (OC) of the (N+1)th prescaler is applied as an input signal to the first terminal (MOD) of the Nth prescaler;

said Nth prescaler being operable such that when the output signal from the fifth terminal (OC) of the (N+1)th prescaler is of an H (or L) level, the Nth prescaler frequency-divides the input signal by (2+D) according to the level of the signal at the second terminal (D), and when the output signal from the fifth terminal (OC) of the (N+1)th prescaler is of an L (or H) level, the Nth prescaler frequency-divides the input signal by 2.

5. A programmable frequency divider according to claim 4, wherein said 2-scale-factor prescalers which are connected in cascade are arranged such that when all input signals applied to the second terminals of subsequent ones of the prescalers are of an L level, said subsequent prescalers are separated from the other prescalers.

* * * * *

UNITED STATES PATENT AND TRADEMARK OFFICE
CERTIFICATE OF CORRECTION

PATENT NO. : 5,065,415
DATED : November 12, 1991
INVENTOR(S) : Kazuo YAMASHITA

It is certified that error appears in the above-identified patent and that said Letters Patent is hereby corrected as shown below:

Column 2, line 50, insert --D-- before "terminal".

Column 4, line 23, delete "the" before "represented".

Column 4, line 32, change "nth" to read --mth--.

Signed and Sealed this

Fifteenth Day of June, 1993

Attest:

MICHAEL K. KIRK

Attesting Officer

Acting Commissioner of Patents and Trademarks